(12) United States Patent
Jordan et al.

(10) Patent No.: US 11,448,549 B2
(45) Date of Patent: Sep. 20, 2022

(54) SYSTEMS AND METHODS FOR SUPERCONDUCTING QUANTUM REFRIGERATION

(71) Applicants: University of Rochester, Rochester, NY (US); Consiglio Nazionale delle Ricerche—CNR, Rome (IT)

(72) Inventors: Andrew N. Jordan, Rochester, NY (US); Francesco Giazotto, Pisa (IT); Sreenath K. Manikandan, Rochester, NY (US)

(73) Assignees: University of Rochester, Rochester, NY (US); Consiglio Nazionale delle Ricerche—CNR, Rome (IT)

( * ) Notice: Subject to any disclaimer, the term of this patent is extended or adjusted under 35 U.S.C. 154(b) by 445 days.

(21) Appl. No.: 16/593,781

(22) Filed: Oct. 4, 2019

(65) Prior Publication Data
US 2021/0102838 A1   Apr. 8, 2021

(51) Int. Cl.
| | | |
|---|---|---|
| *G01J 1/42* | (2006.01) | |
| *H01L 39/22* | (2006.01) | |
| *G06N 10/00* | (2022.01) | |
| *G01J 1/02* | (2006.01) | |
| *H01L 39/10* | (2006.01) | |

(52) U.S. Cl.
CPC ............... *G01J 1/42* (2013.01); *G01J 1/0252* (2013.01); *G06N 10/00* (2019.01); *H01L 39/10* (2013.01); *H01L 39/22* (2013.01)

(58) Field of Classification Search
CPC .......... G01J 1/42; G01J 1/0252; G06N 10/00; H01L 39/10; H01L 39/22
See application file for complete search history.

(56) References Cited

U.S. PATENT DOCUMENTS

| | | | | |
|---|---|---|---|---|
| 2008/0252404 | A1* | 10/2008 | Coombs | G11C 11/15 505/400 |
| 2010/0304977 | A1* | 12/2010 | Sadleir | G01K 3/005 29/599 |
| 2017/0098752 | A1* | 4/2017 | You | H01L 31/02165 |
| 2019/0198618 | A1* | 6/2019 | George | H01L 29/82 |

* cited by examiner

*Primary Examiner* — Paul A Wartalowicz
(74) *Attorney, Agent, or Firm* — Hodgson Russ LLP (57) ABSTRACT

A heat transfer device and method are disclosed. The device includes a working region (i.e., working substance) made from a first superconducting material having a superconducting state and a normal state when magnetized. The first superconducting material has a first energy gap while in the superconducting state. A substrate (i.e., cold reservoir) is connected to the working region at a first tunnel junction. The substrate may be a metallic substrate. A heat sink (i.e., hot reservoir) is connected to the working region at a second tunnel junction. The heat sink is made from a second superconducting material having a second energy gap that is larger than the first energy gap. In a particular example, the heat transfer device includes a metallic substrate is made from Copper, a working region made from Tantalum, a heat sink made from Niobium, and the first and second tunnel junctions are made from Tantalum Oxide.

14 Claims, 8 Drawing Sheets

SYSTEMS AND METHODS FOR SUPERCONDUCTING QUANTUM REFRIGERATION

STATEMENT REGARDING FEDERALLY SPONSORED RESEARCH

This invention was made with government support under DE-SC0017890 awarded by the Department of Energy. The government has certain rights in the invention.

FIELD OF THE DISCLOSURE

The present disclosure relates to heat transfer devices, and more specifically to solid-state heat transfer devices.

BACKGROUND OF THE DISCLOSURE

Modern devices such as ultrafast quantum computers and sensors often require the use of extreme cold temperatures. Although techniques are available for achieving low temperatures, such as the use of dilution refrigerators, there continues to be an unmet need for a reliable heat transfer device that is able to achieve temperatures nearing absolute zero.

BRIEF SUMMARY OF THE DISCLOSURE

A solid state heat transfer technique is presented. The technique is based on repeated adiabatic magnetization/demagnetization cycles of a superconductor which acts as the working substance. The gradual cooling down of a substrate (normal metal) in contact with the working substance is demonstrated for different initial temperatures of the substrate. Excess heat is given to a hot large-gap superconductor. The on-chip refrigerator works in a cyclic manner because of an effective thermal switching mechanism: Heat transport between N/N versus N/S junctions is asymmetric because of the appearance of the energy gap. This switch permits selective cooling of the metal. We find that this refrigeration technique can cool down a 0.3 cm$^3$ block of Copper by almost two orders of magnitude starting from 200 mK, and down to about 1 mK starting from the base temperature of a dilution fridge (10 mK). The corresponding cooling power at 200 mK and 10 mK for a 1 cm×1 cm interface are 25 nW and 0.06 nW respectively, which scales with the area of the interface.

In an aspect, a heat transfer device is provided. The heat transfer device includes a working region made from a first superconducting material having a superconducting state and a normal state when magnetized. The first superconducting material has a first energy gap while in the superconducting state. The first superconducting material may be, for example, Tantalum, Aluminum, Tin, Mercury, or Indium. A metallic substrate is connected to the working region at a first tunnel junction. The metallic substrate may be made from, for example, Copper, Gold, Silver, or Aluminum doped with Manganese.

A heat sink is connected to the working region at a second tunnel junction. The heat sink is made from a second superconducting material. The second superconducting material has a second energy gap that is larger than the first energy gap. The second superconducting material may be, for example, Niobium, Niobium Nitride, Niobium-Titanium, Niobium Nitride-Titanium, Niobium-Germanium, Magnesium Diboride, or a covalent superconductor.

The first and/or second tunnel junctions may be insulators. The first and/or second tunnel junctions may be made from disordered oxides. For example, in an embodiment, the first and/or second tunnel junctions can be Tantalum Oxide (TaO and/or Ta2O5). In a particular example, the metallic substrate is Copper, the first superconducting material is Tantalum, and the second superconducting material is Niobium.

In some embodiments, the heat transfer device includes a magnetizer configured to adiabatically magnetize the working region so as to drive the first superconducting material to the normal state. The magnetizer may be, for example, a current source configured to selectively apply a supercurrent to the heat sink to induce a magnetic field. Other embodiments of magnetizers can be used as may be apparent in light of the present disclosure.

In some embodiments, the metallic substrate is suspended to reduce phonon-mediated thermal transport between the substrate and the working region. In some embodiments, the working region is suspended to reduce phonon-mediated thermal transport between the working region and the heat sink.

In another aspect, the present disclosure may be embodied as a sensor that includes a heat transfer device as described herein (e.g., the heat transfer device is a component of a sensor). In an example, the present disclosure may be embodied as a single-photon detector having a heat transfer device according to any of the embodiments described herein (e.g., the heat transfer device is a component of a single-photon detector).

In another aspect, the present disclosure may be embodied as a method for cooling a substrate. The method includes: providing a substrate connected to a working region at a first tunnel junction, wherein the working region is made from a first superconducting material having a first energy gap; applying a magnetic field to the working region to drive the first superconducting material to a normal state such that a first working temperature of the working region is less than a temperature of the substrate; reducing the magnetic field to drive the first superconducting material to a superconducting state such that the temperature of the working region is increased to a second working temperature; and providing a heat sink connected to the working region at a second tunnel junction, wherein the heat sink is made from a second superconducting material having a second energy gap larger than the first energy gap, and wherein a temperature of the heat sink is less than the second working temperature of the working region. In some embodiments, applying magnetic field to the working region includes applying a supercurrent to the heat sink.

DESCRIPTION OF THE DRAWINGS

For a fuller understanding of the nature and objects of the disclosure, reference should be made to the following detailed description taken in conjunction with the accompanying drawings, in which:

FIG. 1 shows the steps of the refrigeration cycle according to an embodiment of the present disclosure. In step A, the central region (working substance) is thermally isolated from its neighbors, and undergoes adiabatic magnetization from a superconductor to a normal metal, $S_2 \rightarrow N_2$, and cools to a much colder temperature, $T_1$. In step B, thermal contact with the normal metal $N_1$ is made, resulting in heat transfer from $N_1$ to $N_2$, eventually coming to equilibrium at temperature $T_C$. In step C, the working substance is thermally isolated again (black walls), and adiabatically demagnetized from $N_2 \rightarrow S_2$, heating up the system to its hottest temperature $T_4$. In step D, thermal contact with superconductor $S_3$ is made, allowing heat to escape from $S_2 \rightarrow S_3$, reducing the temperature to temperature $T_H$. The cycle closes by closing off thermal contact to $S_3$ with the black wall, and returning to step A.

We have set $T_i = T_H$.

FIG. 7 is a graph showing refrigeration action starting from different initial temperatures 0.2 K, 0.1 K, 0.05 K, and 10 mK, which is the base temperature of a dilution fridge. The operating power of the refrigerator for these initial temperatures are 25 nW, 6 nW, 1.5 nW, and 0.06 nW respectively, for a 1 cm×1 cm interface. For each case, the hot reservoir, the cold reservoir, and the working substance were assumed to be in thermal equilibrium such that their temperatures were identical before the refrigerator is turned on.

DETAILED DESCRIPTION OF THE DISCLOSURE

Figure 2:
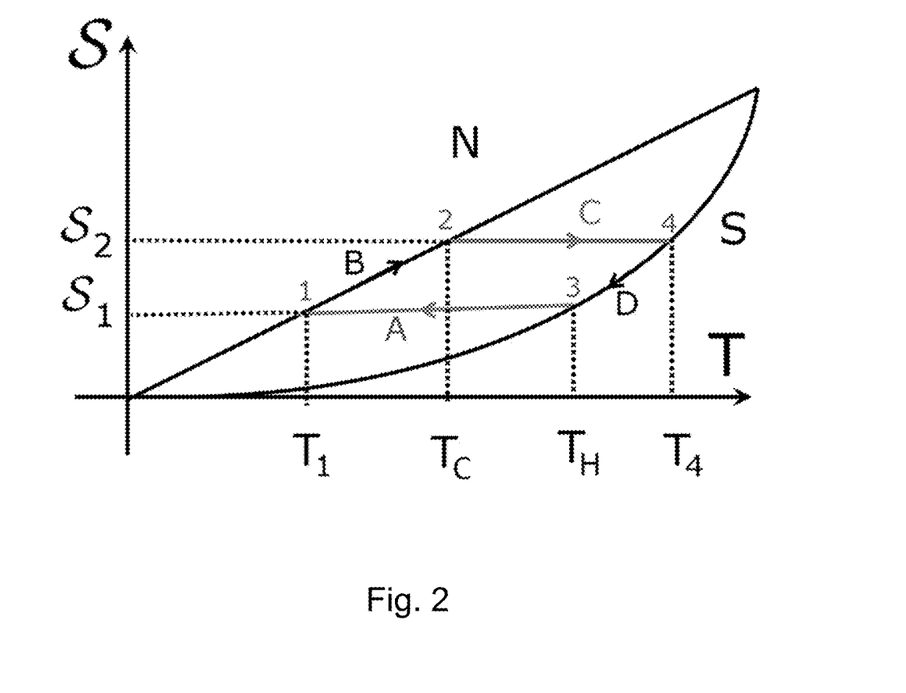
FIG. 2 is a graph showing the entropy of a normal metal and a superconductor, and showing different stages of a refrigeration cycle according to an embodiment of the present disclosure.

It has been known since the earlier days of superconductivity that the process of magnetizing a superconducting material quasistatically and adiabatically can reduce the temperature of the material substantially as it transitions to the normal state. This is because a material in its superconducting state has more order, and therefore, entropy equal to that of a normal metal at a lower temperature. Hence when driven to the normal state adiabatically by an applied magnetic field, the achieved final state is much colder than the initial superconducting state as depicted in the T–S diagram in FIG. 2. There were attempts in the past to try and implement adiabatic magnetization of a superconductor as an effective cooling technique.

In an aspect, the present disclosure may be embodied as a cyclic superconducting heat transfer device (i.e., refrigerator) based on adiabatic magnetization of a superconductor, with a working mechanism similar to that of a domestic refrigerator. A conventional refrigerator operates by cyclically moving a working fluid between hot and cold reservoirs. Work is done by compressing a fluid, and letting it freely expand to a gas in a phase transition where it cools down and absorbs heat from the cold reservoir. The now hot gas is then re-compressed, liquefying it, and then dumps the excess heat to a hot reservoir, which is usually the environment that allows the fluid to thermalize and reset to its initial temperature. The cycle repeats many times such that a stable low final temperature is achieved in the cold reservoir.

In comparison, the working fluid in the present analogy is the electron gas in the working superconductor. The cold reservoir (also referred to herein as a substrate) is a normal metal, and the hot reservoir (also referred to herein as a heat sink) is another superconductor having a larger gap. The superconducting state of electrons in the working substance is analogous to a compressed fluid. With an applied magnetic field, the electron fluid expands in a phase transition into the unpaired normal state at a lower temperature. Heat is then absorbed from the substrate (cold reservoir), and the electron fluid is re-compressed by reducing the applied magnetic field. The working substance, which is now hotter than the heat sink (hot reservoir), has reduced electronic entropy in the paired state. The entropy of phonons has increased in the working substance in proportion, effectively holding the excess heat. Note that here the phonon entropy changes complementary to the electron entropy (in both steps, A and C), such that the sum of the entropy of electrons and phonons remains constant, and the process is adiabatic. Electron-phonon interactions in the working substance and a tunneling contact with the hot reservoir selectively removes hot electrons from the working substance, and facilitate reaching thermal equilibrium in the hot junction. This cycle repeats, establishing a low temperature steady state in the cold reservoir.

Figure 12:
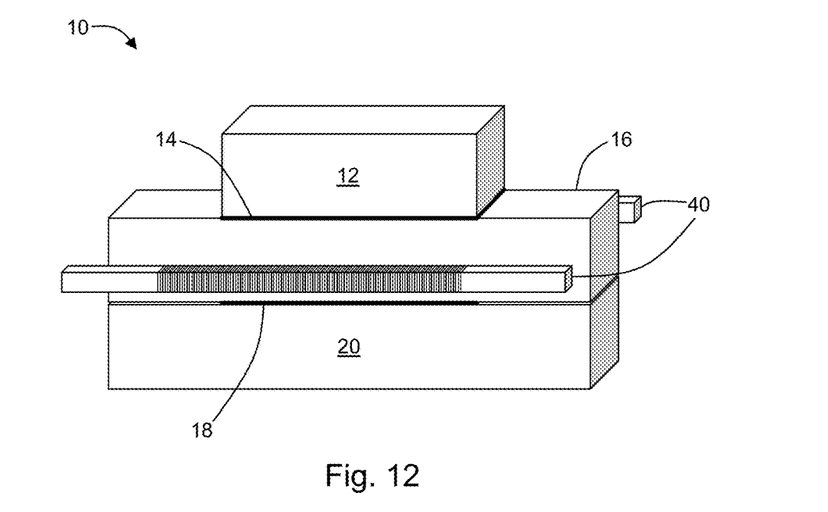
FIG. 12 is a diagram of a heat transfer device according to an embodiment of the present disclosure.

With reference to FIG. 12, the present disclosure may be embodied as a heat transfer device 10. The device 10 includes a metallic substrate 12, which may be, for example, Copper, Gold, Silver, or Aluminum (doped with, e.g., Manganese to suppress superconductivity).

The device 10 includes a working region 16 (sometimes referred to herein as a working substance) made from a first superconducting material. The first superconducting material has a superconducting state and a normal state when magnetized. The first superconducting material has a first energy gap while in the superconducting state. The first superconducting material may be, for example, Tantalum, Aluminum, Tin, Mercury, or Indium. The first superconducting material may be other suitable superconductors that function as described herein.

The working region 16 interfaces with the metallic substrate 12 at a first tunnel junction 14. The first tunnel junction 14 may comprise an insulator, such as, for example, a disordered oxide. In some embodiments, the first tunnel junction 14 may be an oxide of the first superconducting material. For example, where the first superconducting material is Aluminum, the first tunnel junction 14 may be, for example, Aluminum Oxide ($AlO_x$). In another example, where the first superconducting material is Tantalum, the first tunnel junction 14 may be Tantalum Oxide (TaO and/or $Ta_2O_5$).

The device 10 includes a heat sink 20 made from a second superconducting material. The second superconducting material has a second energy gap which is larger than the first energy gap. Suitable materials for the second superconducting material are, for example, Niobium, Niobium Nitride (NbN), Niobium-Titanium (NbTi), Niobium Nitride-Titanium (NbNTi), Niobium-Germanium ($Nb_3Ge$), Magnesium Diboride ($MgB_2$), a covalent superconductor, or other superconductors with a high critical temperature $T_c$. The heat sink 20 interfaces with the working region 16 at a second tunnel junction 18. The second tunnel junction 18 may comprise an insulator, such as, for example, a disordered oxide. In some embodiments, the second tunnel junction is made from the same material as the first tunnel junction. In some embodiments, the second tunnel junction is made from a different material than the first tunnel junction.

The device 10 includes a magnetizer 40 which is configured to selectively, adiabatically magnetize the working region 16 so as to drive the first superconducting material to its normal state. The magnetizer 40 may be, for example, a current source configured to selectively apply a supercurrent to the heat sink 20 so as to induce a magnetic field. The induced magnetic field can be used to magnetize the working region 16. In some embodiments, the magnetizer may be a separate component—i.e., not using the heat sink to create the magnetic field.

In an exemplary embodiment further discussed and detailed below, a heat transfer device is constructed wherein the metallic substrate is made from Copper, a first superconducting material is Tantalum, and the second superconducting material is Niobium. In such an embodiment, the first and/or second tunnel junctions may be made from Tantalum Oxide (TaO and/or $Ta_2O_5$).

Figure 10:
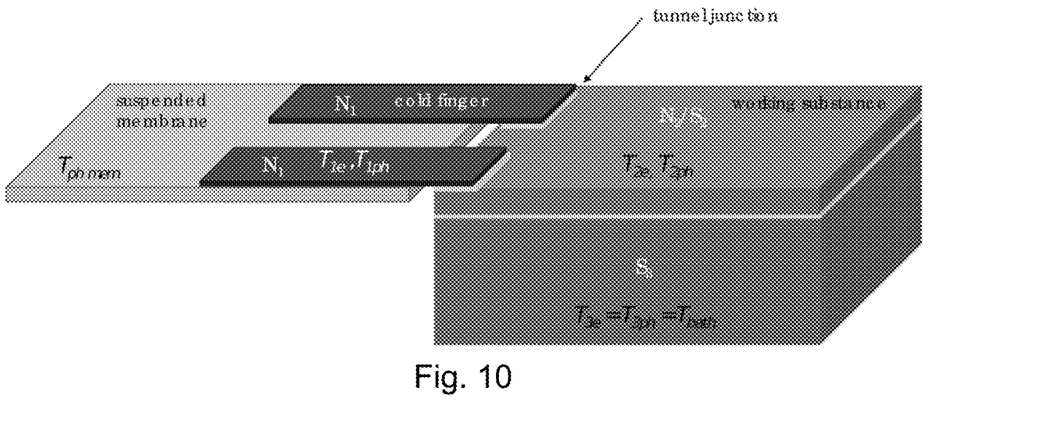
FIG. 10 is a diagram of a heat transfer device according to another embodiment of the present disclosure, wherein the phonon-mediated heat transport (Kapitza coupling) between the working substance and the hot reservoir is suppressed by choosing the tunnel barrier appropriately (selecting barrier specific resistances by a suitable oxidation process—e.g., on the order of 1 MOhm*$\mu m^2$), and the substrate is isolated by suspending it as a membrane to reduce Kapitza coupling. For example, a disordered oxide material, such as but not limited to, Aluminum Oxide or $HfO_2$.
Figure 11:
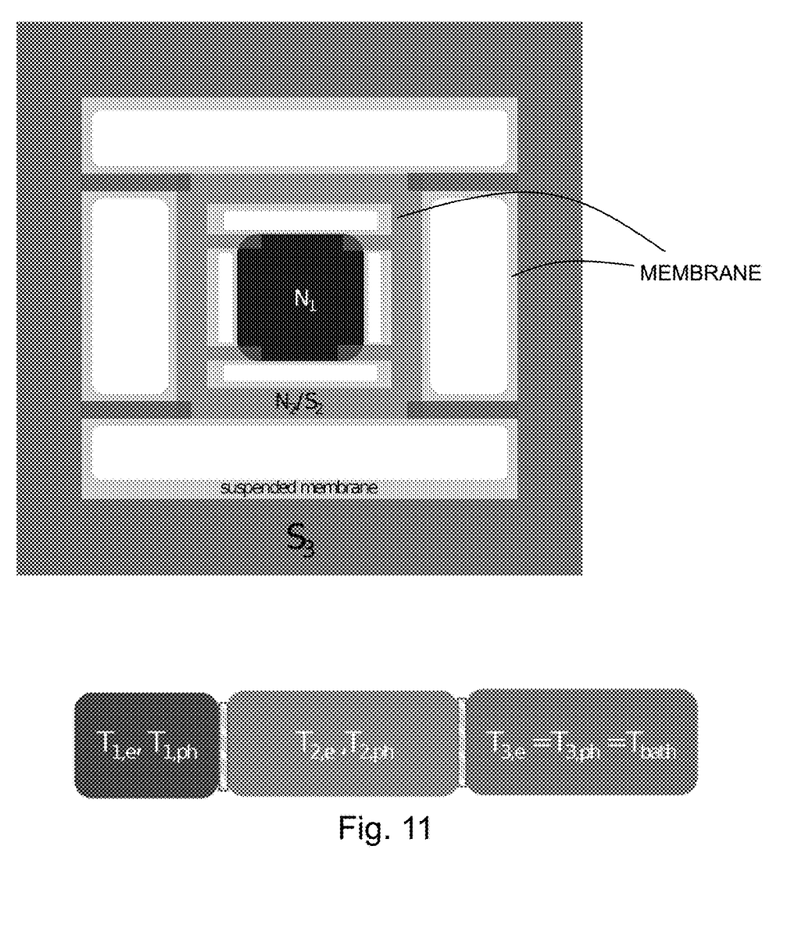
FIG. 11 is a diagram of a heat transfer device according to another embodiment of the present disclosure, wherein the Kapitza coupling across both the junctions is reduced by suspending the working substance and the substrate in separate membranes.

In some embodiments, the substrate is suspended to reduce phonon-mediated thermal transport between the substrate and the working region (see, e.g., FIGS. 10 and 11). In some embodiments, the working region is suspended to reduce phonon-mediated thermal transport between the working region and the heat sink. For example, the substrate and/or working region may be suspended as membranes. In a particular example, a heat transfer device could be constructed on insulating or semiconducting materials, such as, for example, Silicon Dioxide or Silicon Nitride.

Figure 13:
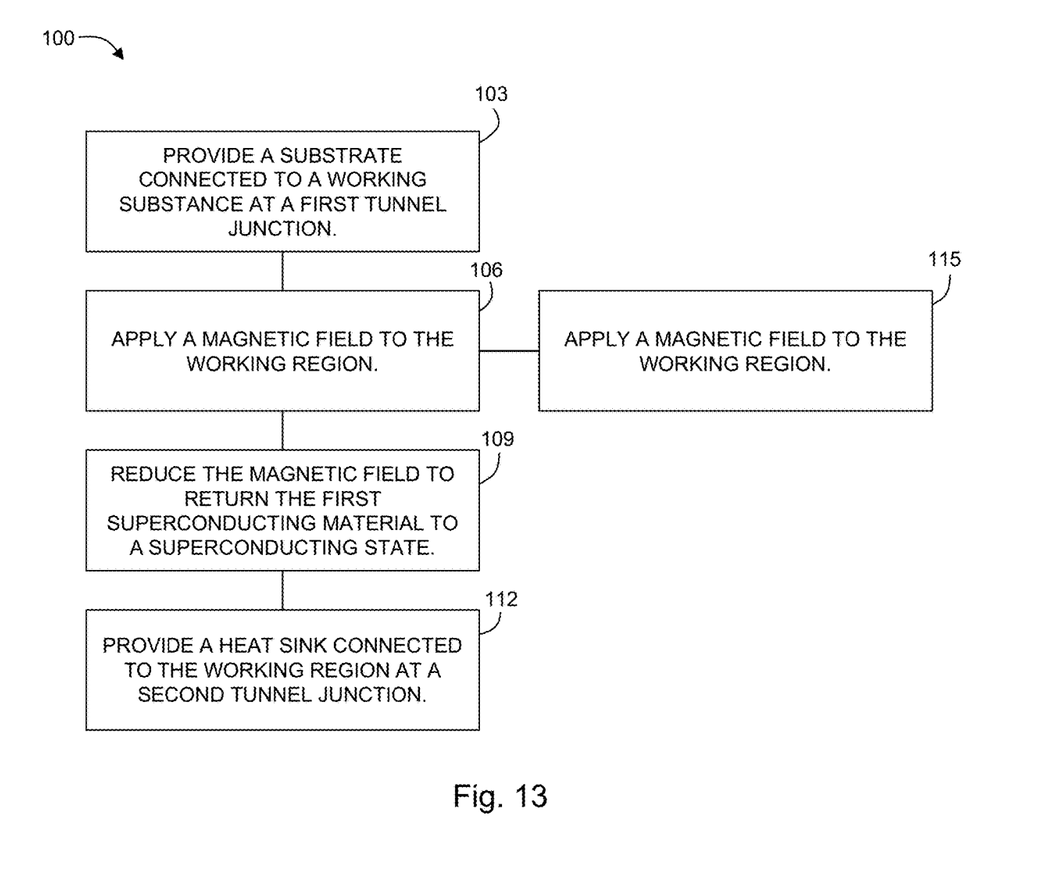
FIG. 13 is a diagram of a method according to an embodiment of the present disclosure.
Figure 14:
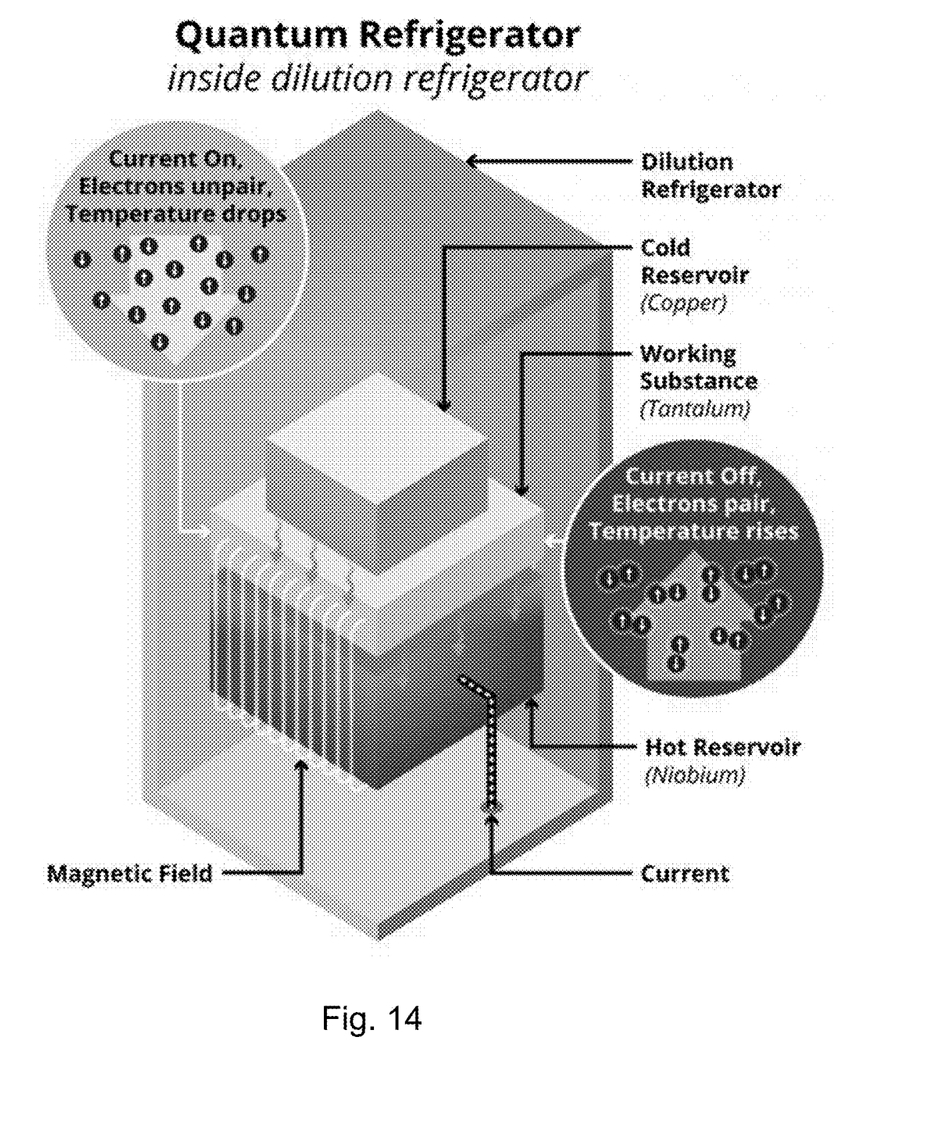
FIG. 14 is a diagram of a device according to an embodiment of the present disclosure and shown within a dilution refrigerator.

In another aspect, the present disclosure may be embodied as a method 100 for cooling a substrate. A substrate is provided 103, wherein the substrate is connected to a working region at a first tunnel junction. The substrate may be, for example, Copper, Gold, Silver, or Aluminum (doped with, e.g., Manganese to suppress superconductivity) or any other substrate described herein. The working region is made from a first superconducting material having a first energy gap. The first superconducting material has a superconducting state and a normal state when magnetized. The first superconducting material may be, for example, Tantalum, Aluminum, Tin, Mercury, Indium, or any other first superconducting materials as described herein. The first tunnel junction may comprise an insulator, such as, for example, a disordered oxide. In some embodiments, the first tunnel junction may be an oxide of the first superconducting material. For example, where the first superconducting material is Aluminum, the first tunnel junction may be, for example, Aluminum Oxide ($AlO_x$). In another example, where the first superconducting material is Tantalum, the first tunnel junction may be Tantalum Oxide (TaO and/or $Ta_2O_5$).

A magnetic field is applied 106 to the working region to drive the first superconducting material to a normal state. In this way, a first working temperature of the working region is caused to be less than a temperature of the substrate allowing heat to be transferred from the substrate to the working region. In some embodiments, the magnetic field is applied 106 by applying 115 a supercurrent to a heat sink (further described below). The magnetic fields is reduced 109 so as to drive (e.g., return) the first superconducting material to a superconducting state. In this way, the temperature of the working region increases to a second working temperature.

The method 100 includes providing 112 a heat sink connected to the working region at a second tunnel junction. The heat sink has a temperature which is less than the second working temperature of the working region. The heat sink is made from a second superconducting material having a second energy gap larger than the first energy gap. The second superconducting material has a second energy gap which is larger than the first energy gap. Suitable materials for the second superconducting material include, for example, Niobium, Niobium Nitride (NbN), Niobium-Titanium (NbTi), Niobium Nitride-Titanium (NbNTi), Niobium-Germanium ($Nb_3Ge$), Magnesium Diboride ($MgB_2$), a covalent superconductor, or other superconductors with a high critical temperature $T_c$. The second tunnel junction may comprise an insulator, such as, for example, a disordered oxide. In some embodiments, the second tunnel junction is made from the same material as the first tunnel junction. In some embodiments, the second tunnel junction is made from a different material than the first tunnel junction.

Further Discussion and Exemplary Embodiments

The cyclic superconducting refrigerator—Adiabatic magnetization of a superconductor preserves the total entropy of the material such that the entropies of the two phases are equal, $S^N(T_f, H=H_c)=S^S(T_i, H=0)$, where H is the applied magnetic field. This results in cooling of the material to a final temperature $T_f$ that is approximately equal to $T_i^3/T^{*2}$. Here $$T_*^2 = \frac{\gamma_2}{\alpha_2},$$

is a characteristic temperature of the working substance. In the non-limiting examples of the disclosure, Tantalum as the working substance for which $T^*=11.6$ K.

Figure 1:
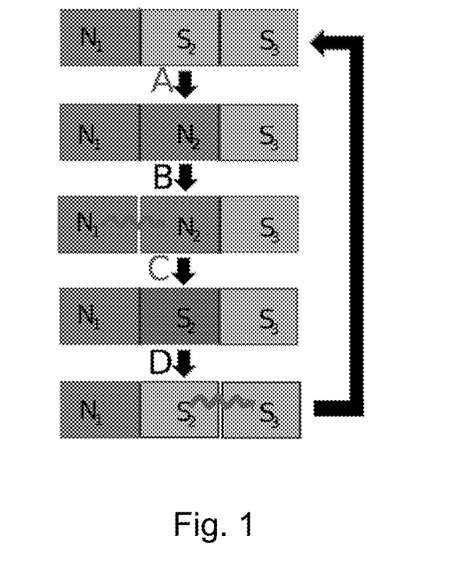

For the cyclic superconducting refrigerator presented herein, the magnetic field inducing the phase transition, when applied quasi-statically, can be reversed quasi-statically to its initial value and therefore reversing the superconducting to normal phase transition of the working substance. This cycle can be performed repeatedly, where the working substance is driven between two different temperatures (hot and cold), envisaging a refrigeration cycle. The energy transfer is asymmetric. That is, energy flow has a preferred direction that is different for the different phases, as a consequence of the energy-structure of the N/S materials (see FIGS. 2 and 3). Exemplary embodiments of the present disclosure are illustrated in FIG. 1 (method) and FIG. 5 (device).

For the discussion, the initial temperature of the working substance is assumed to be $T<0.1$ $T_c$ of the working substance, such that its specific heat in the superconducting state can be approximated by:

$$C_S = 3\alpha T^3 + a\gamma T_c \exp(-bT_c/T), \quad (1)$$

where b=1.44, and a=9.14. Here $\gamma$ and $\gamma$ are parameters specifying its specific heat at the normal state, $C_N = 3\alpha T^3 + \gamma T$. Here the common $T^3$ term is the phononic (Debye) contribution to the specific heat. In the superconducting case, the exponential behavior of the electronic specific heat of the superconductor at low temperatures can be associated to the presence of a superconducting gap. The critical field as a function of temperature can be found from free energy differences, which agrees reasonably well with the empirical formula, $H_c(T)=$ $$H_0\left(1 - \frac{T^2}{T_c^2}\right), \text{ for } T < T_c,$$

where $H_0$ is the zero-temperature critical field of the working substance. We consider $B_0 = \mu_0 H_0 \simeq -0.08$ T as the critical magnetic field at zero temperature for the exemplary working substance, Tantalum.

We can calculate some ideal thermodynamic properties of the cyclic refrigerator. The temperature of the hot reservoir is $T_H$. The working substance is in thermal equilibrium with the hot reservoir initially and the following cycle occurs (see FIGS. 1 and 2):

Step A: A quasistatically applied magnetic field drives the working substance to the normal state. The transformation is iso-entropic and the working substance cools down to $T_1 = T_H^3/T^{*2}$. Magnetic work $W_{3,1}$ is done.

Step B: The working substance is put in contact with the cold reservoir (substrate) where it absorbs heat $Q_C$. Since the electronic contribution to the entropy and specific heat dominates in the normal state, the transferred heat per unit volume can be approximated, $$Q_C = \int TdS = \frac{\gamma_2}{2}(T_C^2 - T_1^2).$$

The temperature $T_C$ can be identified as the equilibrium final temperature between the cold reservoir and the working substance, approximated as $$T_C \simeq \sqrt{\frac{\gamma_2 T_1^2 + \gamma_1 T_i^2}{\gamma_1 + \gamma_2}} > T_1,$$

where $T_i$ is the initial temperature of the substrate prior to the cycle. Maximum cooling power is obtained when $T_i = T_H$, and the cooling power tends to zero when $T_i \rightarrow T_1$. Here $\gamma_1 T_i$ is the electronic entropy of the substrate.

Step C: The electron fluid in the working substance is re-compressed by reducing the magnetic field quasi-statically and adiabatically, where it returns to the superconducting state at temperature $T_4 = (T_C T^{*2})^{1/3}$. Magnetic work $W_{2,4}$ is done.

Step D: The working substance is put in contact with the hot reservoir (heat sink). Since the reservoir has a high specific heat and bandgap, the final temperature achieved can be approximated to the temperature of the hot reservoir $T_H$. In this process, the amount of heat transferred to the hot reservoir per unit volume is given by, $$Q_H = \int TdS = \frac{3\alpha_2}{4}(T_4^4 - T_H^4).$$

We have approximated the entropy lines for the superconducting state to be only phononic, since the electronic contribution goes to zero exponentially at low temperatures.

Figure 4:
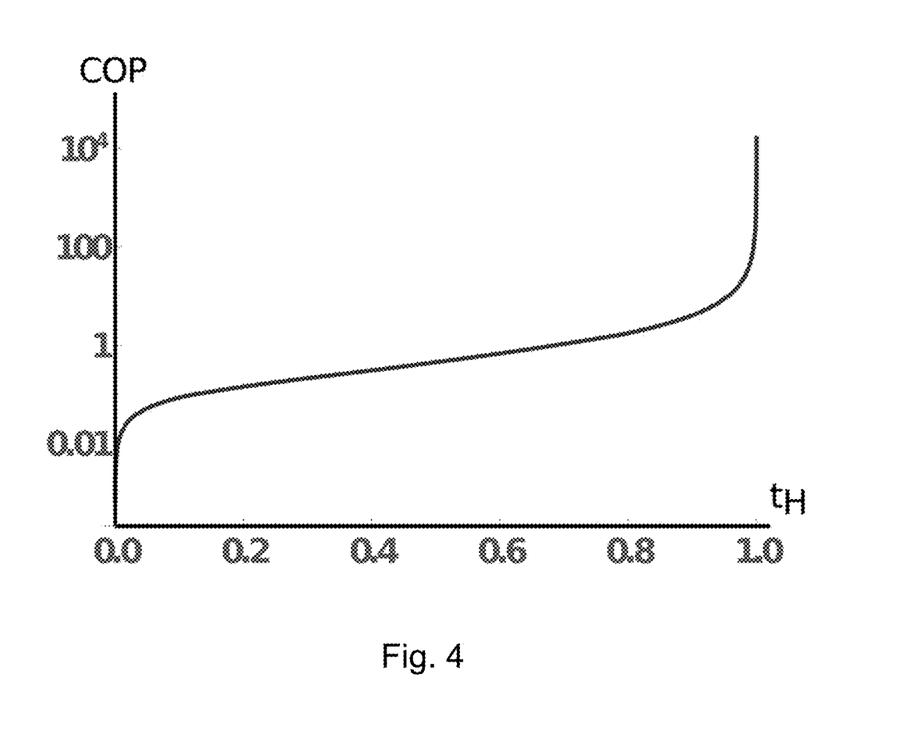
FIG. 4 is a graph showing a Coefficient of Performance (COP) of an embodiment of the presently-disclosed refrigerator, evaluated as a function of $$t_H = \frac{T_H}{T_*}.$$

FIG. 1 illustrates this ideal process. By the first law, we have $W_{3,1} + Q_{1,2} + W_{2,4} + Q_{4,3} = 0$. Defining $W = W_{3,1} + W_{2,4}$, we have $W = -Q_{4,3} - Q_{1,2} = Q_H - Q_C$. The Coefficient of Performance (COP) is the ratio of heat taken from the cold reservoir $Q_C$ to work W given by:

$$COP = \frac{Q_C}{W} = \frac{t_C^2 - t_H^6}{\frac{3}{2}(t_C^4 - t_h^4) - (t_C^2 - t_H^6)}, \quad (2)$$

where $t_H = T_H/T^*$, $t_C = T_C/T^*$. See FIG. 4, where the coefficient of performance is plotted as a function of $$t_H = \frac{T_H}{T_*}.$$

In the above idealized analysis, an on/off-type energy exchange is assumed, so heat transfer to either a hot reservoir or a cold reservoir can be made on demand, like a piston operating a heat-transfer switch. While liquid-gas refrigerators can make a good approximation to this idealized description because of their ability to be freely moved around, solid state systems do not have such freedom. Instead, appropriate physics are designed to effectively turn on and off a switch of exchanging heat with either a hot reservoir or a cold reservoir in order to make an effective solid-state refrigerator. Below, we show that the asymmetry of heat transport between normal metals and superconductors has such a "switch" built in, which permits selectively cooling down the cold reservoir, due to the presence of an energy gap in the superconductor.

Figure 8:
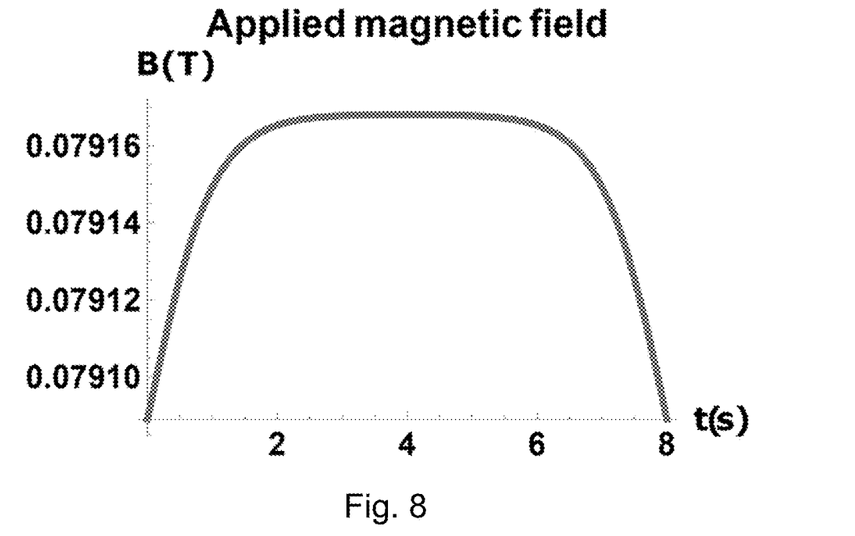
FIG. 8 is a graph showing an exemplary applied magnetic field profile [same form for different realizations, $H(t)=(1-n)H_C(T_i)+H_C(0)-(1-n)H_C(T_i))\tanh(t/\tau)$ until $t=4\tau$, and then reduced symmetrically].

For efficient cooling, it is desired that the working substance, when it is cold, is as much thermally isolated from the hot reservoir as possible so that a significant amount of heat is absorbed from the cold reservoir (e.g., the substrate which is to be cooled). To achieve this, a hot reservoir superconductor having a larger gap is considered. As a result, there is significantly less backflow of quasi-particles from the hot reservoir to the working substance when the working substance is colder (in its normal state), and there is more in-flow of heat from the cold reservoir to the working substance, since both are in their normal state. The population of quasi-particle excitations in the reservoir superconductor, which could potentially tunnel back to the working substance when it is colder, are exponentially suppressed by the presence of a large superconducting energy gap in the hot reservoir. Similarly, the reverse flow of heat from the working substance to the cold reservoir, when the working substance is hot (i.e., in its superconducting state) is also exponentially suppressed due to the appearance of the superconducting gap. Therefore, in each cycle, there is more heat absorbed from the cold reservoir, than the reverse flow of heat. This is further facilitated by maintaining a high magnetic field for most of the time in each cycle [see FIG. 8] such that the working substance spends most of its time in each cycle in the cold (normal) state. A majority of the excess heat is distributed in the phonon modes of the working substance. By increasing the volume of the working substance (and therefore its specific heat) relative to the volume of the cold reservoir, the temperature of the working substance increases at a relatively slow rate with the amount of heat absorbed, compared to the decrease in temperature of the cold reservoir in each cycle, adding to efficient cooling. Electron-phonon scattering and contact with the large gap superconductor further facilitates achieving thermal equilibrium in the hot junction, by selective removal of high energy quasi-particles from the working substance. In practice, the hot reservoir superconductor can also come in direct contact with rest of the internal environment of a dilution refrigerator which sets the initial equilibrium temperature. Here, the hot reservoir superconductor also provides additional thermal isolation between the working substance and the base contact, owing to the presence of a large superconducting gap in the reservoir.

Figure 5:
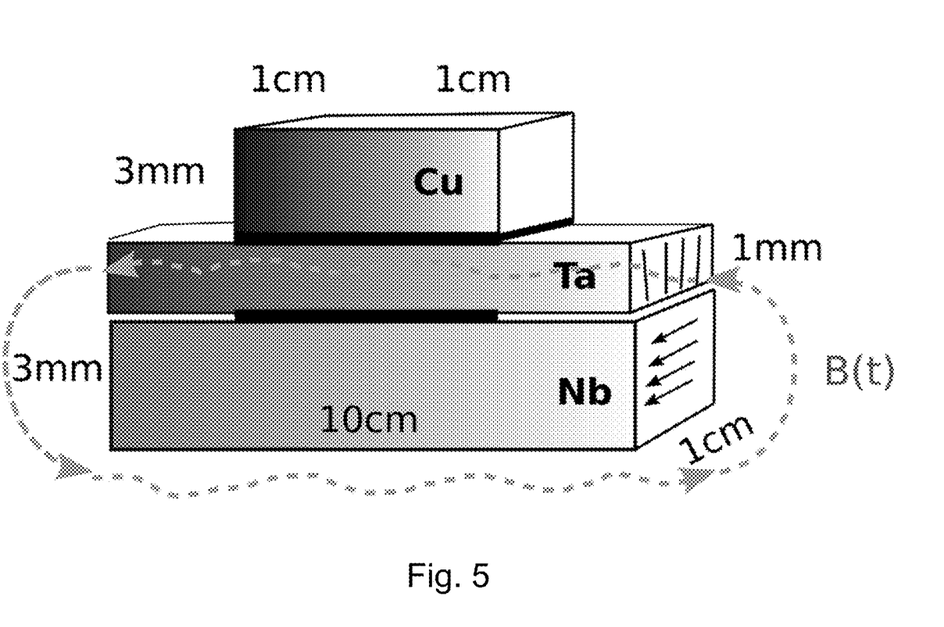
FIG. 5 is a diagram of a heat transfer device (i.e., refrigerator) according to an embodiment of the present disclosure, wherein Copper (Cu, $\gamma = 0.69$ mJ/(mol $K^2$), Debye temperature $\theta_D = 347$ K) is used as the substrate, Tantalum (Ta, $\gamma = 5.87$ mJ/(mol $K^2$), $\theta_D = 246$ K) as the working substance, and Niobium (Nb, $\gamma = 7.80$ mJ/(mol $K^2$), $\theta_D = 276$ K) as the hot reservoir. In some embodiments, a super-current can be applied in the Nb, which generates the magnetic field that drives the phase transition in the adjacent working substance.
Figure 6:
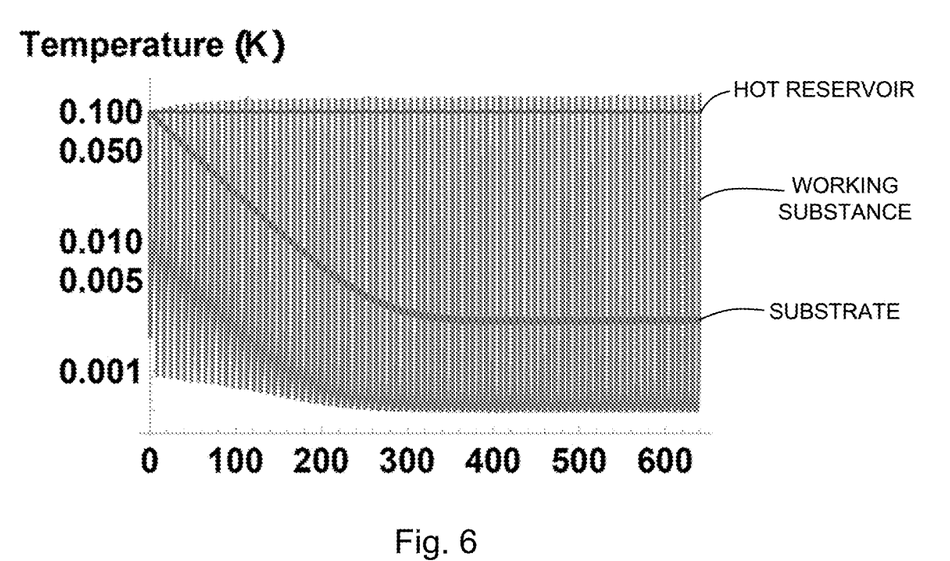
FIG. 6 is a graph showing repeated cooling cycles of a junction refrigerator, starting from 100 mK, showing the temperature of the working substance (the oscillating trace), the temperature variation of the substrate (steady decrease with oscillations <1 mK), and the temperature of the hot reservoir.

A large gap superconductor as the hot reservoir is also desired, if we need to produce the magnetizing B field by running a super-current in the reservoir superconductor [see FIG. 5], without breaking the hot reservoir's own superconductivity. In a non-limiting example, Niobium is used as the large gap superconductor. Niobium has a higher critical field ($B_0 \sim 0.82$ T) compared to Tantalum ($B_0 \sim 0.08$ T). Therefore, in embodiments where a supercurrent in the hot reservoir is used to produce the magnetizing B field, Niobium can sustain the supercurrent without breaking its own superconductivity. Niobium is also type II, and therefore it can enter a mixed state with normal vortices. It is still acceptable as the lower critical field above which Niobium enters a mixed state has been measured around 0.19 T, which is still higher than the critical field of Tantalum. It is also assumed that the Kapitza coupling across the tunnel junctions can be avoided by choosing the disordered tunnel barriers so as to cause phonon mismatch, and prevent phonon-mediated heat transport. For example, the tunnel barriers may be a disordered oxide, such as, for example when Tantalum is used as a superconductor, oxidizing the Tantalum, (TaO or $Ta_2O_5$). This is another desired feature for the experimental implementations of the refrigeration scheme presented below.

Figure 9:
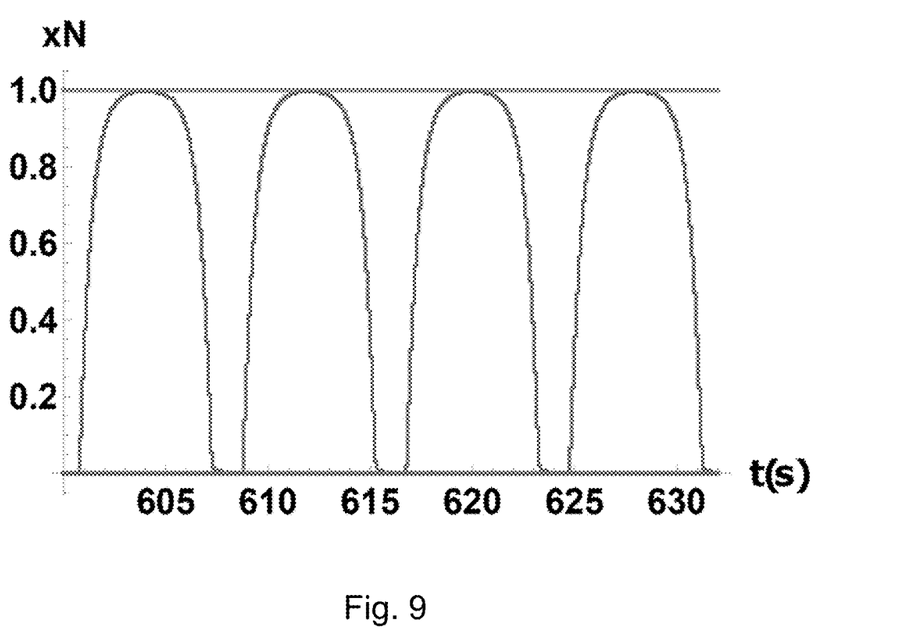
FIG. 9 is a graph showing the variation of the fraction of normal metal in the working substance during repeated cooling cycles of a simulated junction refrigerator, for $T_i=100$ mK.

Continuous adiabatic cooling—Here we provide a dynamical description for the gradual cooling of a substrate $N_1$ in contact with the working substance $S_2/N_2$, which is subsequently in contact with a hot reservoir, $S_3$. The quasi-particle tunneling across the interface and the dissipative effects determine the temperature evolution of the three regions, 1: substrate ($T_L$), 2: working substance ($T_w$), 3: hot reservoir ($T_R$). The adiabatic description for cooling of the working substance with dissipative effects is governed by the relation $$\frac{dS_w}{dt} = \frac{P_w(t)}{T_w(t)},$$

where $$S_w(T_w,t) = x_N(T_w,t) S_w^N(T_w) + (1-x_N(T_w,t)) S_w^S(T_w), \quad (3)$$

and $P_w$ is the net dissipative power per unit volume in the working substance, due to thermal contacts and eddy currents, and $T_w$ is the temperature of the working substance. Here, $x_N(T_w, t)$ is the fraction of normal metal in the working substance at time t given by:

$$x_N(T_w, t) = 1 - n^{-1}\left(1 - \frac{H(t)}{H_c(T_w)}\right), \quad (4)$$

where H(t) is the applied magnetic field and n is the demagnetization factor of the material. We set $n = 5 \times 10^{-4}$ for the working substance. Variation of $x_N$ for the exemplary refrigeration protocol in shown in FIG. 9, which shows that the fraction increases from zero to one, and then falls back to zero in the proposed magnetization cycle. The dynamics of the refrigerator are described by the following set of simultaneous differential equations (assuming unit volume):

$$C_{N_1}(T_L)\dot{T}_L = -X_N(T_w, t)P_{N_1,N_2}^{qp} + P_{load} - (1-x_N(T_w, t))P_{N_1,S_2}^{qp}$$

$$C_w(H, T_w)\dot{T}_w = x_N(T_w, t)(P_{N_1,N_2}^{qp} - P_{N_2,S_3}^{qp}) + (1-x_N(T_w, t))(P_{N_1,S_2}^{qp} - P_{S_2,S_3}^{qp}) + P_{mag} + P_{eddy} \quad (5)$$

A similar dynamical equation exists for $T_R$, but for a large volume of the hot reservoir, and coupling to a support at fixed initial temperature, we can safely assume that $\dot{T}_R = 0$. The specific heat $C_w$ is the specific heat of the intermediate state, given by:

$$C_w(H, T_w) = x_N C_N(T_w) + (1-x_N)C_S(T_w) + C_V^{Lat}(H, T_w), \quad (6)$$

where $$C_V^{Lat}(H, T_w) = \left(\frac{T_w H}{\mu_0 n H_c^2(T_w)}\right) \times (S_w^N(T_w, 0) - S_w^{S(T_w,0)})^2 \quad (7)$$

corresponds to the latent heat of the phase transition. The competing cooling power is:

$$P_{mag} = \frac{\mu_0}{n} T_w \frac{dH_c(T_w)}{dT_w} \dot{H}. \qquad (8)$$

Figure 7:
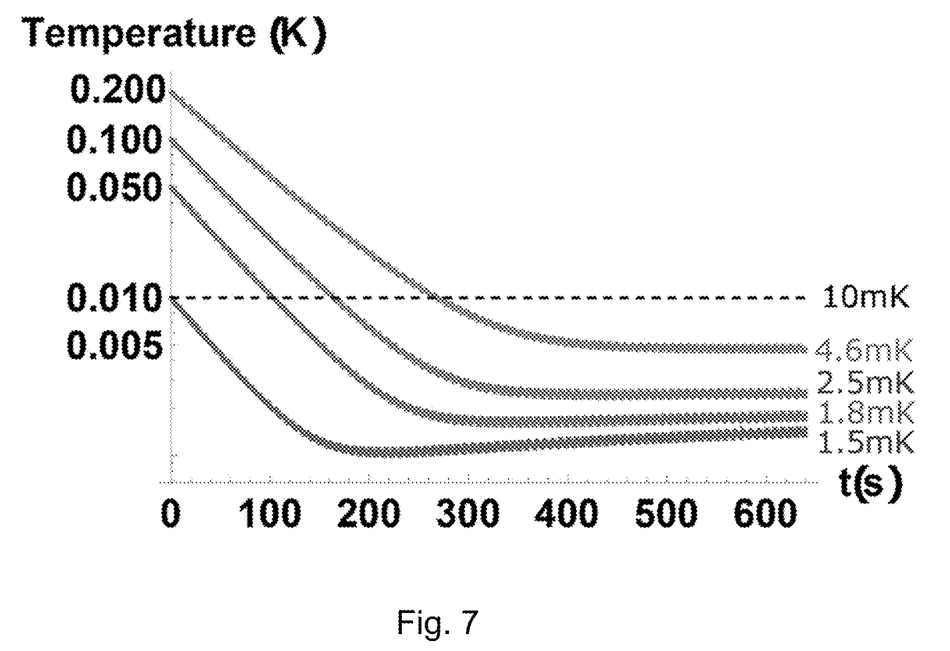

The electron and phonon temperatures are treated identically in Eq. (5), because electron-phonon relaxation occurs much faster compared to adiabatic magnetization, which is a slow process. Under this assumption, here $P_{load}$ accounts for a small heating contribution from thermal contacts by treating them as hot-spots, where lattice temperature is approximately constant in the immediate neighborhood of the contact. The heating power at each contact varies as:

$$P_{ct} = \Sigma V_{ct}(T_i^q - T_L^q), \qquad (9)$$

where to a good approximation, the dissipation is caused due to electron-phonon scattering at the contact (which sets q=5), with the phonon/lattice temperature in the neighborhood of the contact held fixed at the initial equilibrium temperature $T_i$. The volume $V_{ct}$ of the thermal hot-spot at the contact is modeled as a sphere of radius $r_{ct}$. Here $\Sigma = 2 \times 10^9$ WK$^{-5}$m$^{-3}$ is the electron phonon coupling constant for Cu. In simulations, two such hot-spots were considered with $r_{ct} \sim 600$ nm each, accounted by $P_{load}$. This adds only a maximum heating contribution of nearly 1 pW at $T_i = 200$ mK, ~0.03 pW at $T_i = 100$ mK and ~1 fW at 50 mK, which are much smaller compared to the respective cooling powers in the nW range (see FIG. 3). The heating contribution further drops down with the ambient temperature $T_i$, set by the lowest temperature achievable in a dilution fridge. In each of the cooling curves in FIG. 7, the exemplary refrigerator was assumed to begin functioning from different ambient cold temperatures $T_i$ achieved in a dilution fridge, and the contacts are assumed in thermal equilibrium at this ambient temperature, $T_i$.

The working substance can heat up due to eddy currents introduced by the magnetic field $B = \mu_0 x_N(T_w, t) H_c(T_w)$ varies as $$P_{eddy}(t) = \frac{A^2 \dot{B}^2}{R_w},$$

where A is the area which the normal component of the field is passing through, and $R_w$ is the bulk resistance of the working substance. Eddy current effects can be reduced by a factor $$\propto \frac{1}{N_w^2},$$

by subdividing the bulk into $N_w$ thin sheets. We assumed $N_w \sim 10^2$ in the simulations. Note that such a laminar formation occurs naturally in the effective description of the intermediate state where the metal and superconducting phases coexist with alternating thin strips of metal and superconducting phases, and the magnetic field lines pass only through the normal phase.

The quasiparticle power (energy exchange per unit time) transported between two normal metals is:

$$P_{N_1,N_2}^{qp} = \frac{2}{e^2 \mathcal{R}} \int_0^\infty E dE (\mathcal{F}_1(T_L) - \mathcal{F}_2(T_w)) = \frac{1}{e^2 \mathcal{R}} \frac{\pi^2 k_B^2}{6} (T_L^2 - T_w^2). \qquad (10)$$

Here $\mathcal{F}(T)$ is the Fermi-Dirac distribution at temperature T, $k_B$ is the Boltzmann constant, and $$\mathcal{R} = \frac{\mathcal{R}_S}{\mathcal{A}}$$

is the normal state resistance of the junction. The specific resistance $\mathcal{R}_S$ was assumed to be 2 M$\Omega\mu$m$^2$, and identical for both the junctions. As expected, good energy transfer was found (going as a power law of the temperature difference) because of the density of states-matching of the two normal metals. The maximum cooling power provided by the junction can be calculated from Eq. (10). As noted previously, maximum cooling power is obtained when $T_L = T_i = T_H$, and $$T_w = \frac{T_H^3}{T_*^2}.$$

Substituting, we obtain:

$$P_{max}^c = \frac{\gamma_2}{e^2 \mathcal{R} \alpha_2} \frac{\pi^2 k_B^2}{6} t_H^2 (1 - t_H^4). \qquad (11)$$

Using the parameters mentioned in the caption of FIG. 5, we obtain $$T_* = \sqrt{\frac{\gamma_2}{\alpha_2}} = 11.6$$

K for Tantalum. For a specific resistance $\mathcal{R}_S = 2$ M$\Omega\mu$m$^2$, a 10 cm×10 cm contact has resistance $\mathcal{R} = 2 \times 10^{-4} \Omega$, yielding the cooling power at 10 mK nearly equal to 6 nW. Further maximizing $P_{max}^c$ over $t_H$, we obtain the optimal point of operation $$t_H^{max} = \frac{1}{3^{1/4}} \simeq 0.76.$$

Because the exemplary refrigerator operates below the critical temperature $T_{c_w}$ of the working substance, the optimal point of operation is achievable if $$t_{c_w} = \frac{T_{c_w}}{T_*} > t_H^{max},$$

i.e., when $$0.746 \frac{\Delta_2}{k_B} \left(\frac{\alpha_2}{\gamma_2}\right)^{\frac{1}{2}} > 1, \text{ using } k_B T_c = \frac{\Delta}{1.764} \quad (12)$$

from the BCS theory. The ideal refrigerator sketched in FIG. 5 has a COP=1.65 at this optimal point.

Similarly, the quasiparticle power exchange between a normal metal and a superconductor is given by, $$P_{N_1,N_2}^{qp} = \frac{2}{e^2 R} \int_{\Delta_2}^{\infty} E dE \frac{E}{\sqrt{E^2 - \Delta_2^2}} (\mathcal{F}_1(T_L) - \mathcal{F}_2(T_w)) \simeq \quad (13)$$

$$\frac{2}{e^2 R} \left[ \left( \Delta_2^2 K_0 \left[ \frac{\Delta_2}{k_B T_L} \right] + \Delta_2 k_B T_L K_1 \left[ \frac{\Delta_2}{k_B T_L} \right] \right) - \left( \Delta_2^2 K_0 \left[ \frac{\Delta_2}{k_B T_w} \right] + \Delta_2 k_N T_w K_1 \left[ \frac{\Delta_2}{k_B T_w} \right] \right) \right].$$

Here $\Delta_2$ is the energy gap of $S_2$, and $K_{0,1}(x)$ are modified Bessel functions of order 0 and 1. A similar relation can be found for $P_{N_2,S_3}^{qp}$. In pursuing the integrals, we have assumed low temperatures such that the integrals are effectively approximated using Laplace transformations. For large $\Delta_2/k_B T_{L,w}$, the asymptotic expansion of Bessel function, $K_n(x) \sim e^{-x} \sqrt{\pi/2x}$, insures an exponential cut-off of the transport between the N/S junction, acting as the desired switch.

Figure 3:
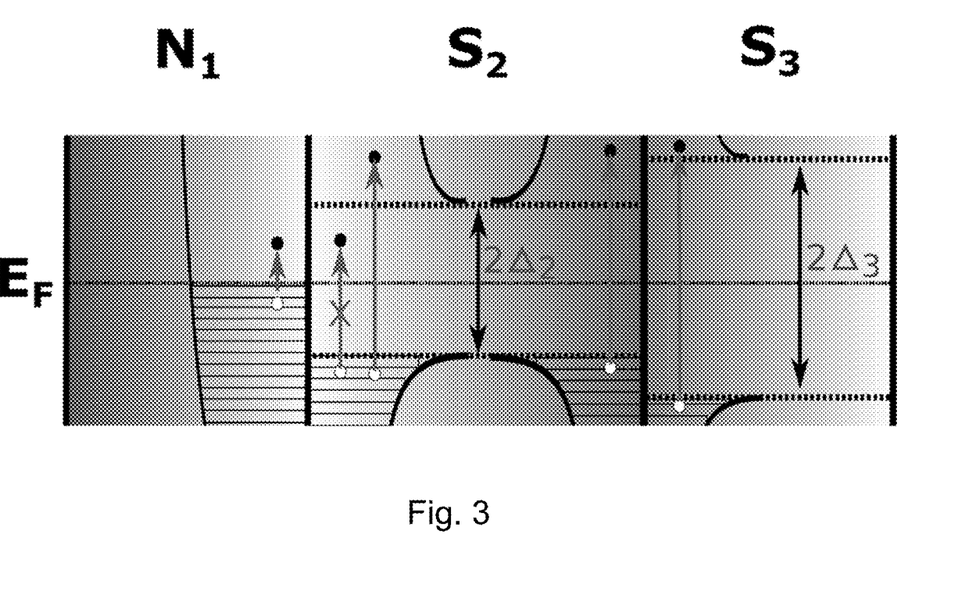
FIG. 3 is an energy diagram of the junctions of a device according to the present disclosure when the working substance is in the hot (superconducting) state. Thermal excitations which create quasi-particles carrying the heat flux are indicated by vertical arrows (gray arrows pointing up). The appearance of an energy gap in the hot superconducting phase of the working substance exponentially suppresses the reverse heat flux between the working substance and the cold reservoir, since quasi-particle excitations are forbidden below the gap. Further, coupling to the hot reservoir superconductor with a larger superconducting gap facilitates selective removal of high energy quasi-particles from the working substance. The gap energies, and the Fermi energy $E_F$ are marked in the diagram.

The heat exchange between the two superconducting elements has two contributions, the quasiparticle power exchange, $P_{S_2,S_3}^{qp}$ and a term depending on the Josephson phase, $\phi = \phi_R - \phi_w$, $P_{S_2,S_3}^{\Phi}$. Here $\phi_R$, $\phi_w$ are respectively the phase of the superconducting BCS wavefunctions of R and w. The quasiparticle tunneling power across the $S_2/S_3$ junction is approximated, $$P_{S_2,S_3}^{qp} \simeq \frac{1}{e^2 R} \frac{\sqrt{2\pi} \Delta_3^{\frac{5}{2}}}{\sqrt{\Delta_3^2 - \Delta_2^2}} \quad (14)$$

$$\left( \sqrt{k_B T_w} e^{-\Delta_3/(k_B T_w)} \times \cosh\left(\frac{\hbar \phi}{2 k_B T_w}\right) - \sqrt{k_B T_R} e^{-\Delta_3/(k_B T_R)} \right),$$

where we have assumed that the difference $\Delta_3 - \Delta_2$ is much bigger than the thermal energies of quasiparticles which help reduce the back-flow of heat from the reservoir to the working substance. The magnitude of the $\phi$ dependent term is always smaller than $P_{S_2,S_3}^{qp}$ and is given by $P_{S_2,S_3}^{\Phi} = -\Delta_2/\Delta_3 P_{S_2,S_3}^{qp} \cos \phi$. In the examples considered, we have taken $T_{c_R} = 4.48$ K for Tantalum, $T_{c_R} = 9.29$ K for Niobium. The refrigerator operates below 0.1 $T_{c_w}$ in the examples presented, where the superconducting gap remains constant at its zero temperature value. In FIG. 3, we have set $\phi = 0$, and $\dot{\phi} = 0$. In general, the relative phase between the superconductors provides another control knob in the problem, and is significant in determining the cooling power when the magnetizing cycles are applied faster than the thermal relaxation time of the Josephson junction.

In some embodiments, suspended membrane(s) may be used to reduce the Kapitza coupling in order to inhibit phonon thermal transport between interfaces (see FIGS. 10 and 11).

The Kapitza coupling for an interface between materials j and k, with phonon temperatures $T_{ph_j}$ and $T_{ph_k}$, is given by:

$$P_{ph_j,ph_k} = KA(T_{ph_j}^4 - T_{ph_k}^4), \quad (15)$$

where A is the area of the interface, and K is the coupling ~200 Wm$^{-2}$K$^{-4}$, for typical metal interfaces. In general, different temperatures for electrons and phonons can be investigated in this scheme, as marked in the figures. Negligible Kapitza coupling, and fast electron-phonon interaction relative to the adiabatic magnetization process, ensures that the electron/phonon temperatures can essentially be treated as the same during the quasi-static operation of the refrigerator, as described in Eq. (5) above.

Although the disclosure describes a refrigeration scheme in which conventional s-wave superconductivity and the BCS description holds, we note that similar adiabatic cooling effects can be achieved in high-temperature superconductors as well. For example, cooling by adiabatically increasing the super-current in a high temperature superconductor has been studied, which could be an alternate way of achieving single shot adiabatic cooling with superconductors.

It should be noted that a high temperature superconductor may increase the operating temperature of the refrigerator, but cooling down a normal metal may still be more efficient in the low temperature regime, as the phonon entropy ($\propto T^3$), and electron phonon scattering ($\propto T^5$) starts to dominate at high temperatures, effectively nullifying any cooling effect in the normal metal from electron-mediated transport phenomenon at the interface.

Additional embodiments building from the disclosed device are possible. For example, if another set of metal/superconductor junctions is placed on the other side of the metal (substrate) to be cooled, then out-of-phase double-action refrigeration is possible, where one side continues to cool the metal down while the other side is heating up and ejecting its excess heat. The presently-disclosed solid state refrigeration technique can be very effective for achieving significant cooling in superconducting circuits, and for applications such as superconducting single photon detectors and sensors.

Although the present disclosure has been described with respect to one or more particular embodiments, it will be understood that other embodiments of the present disclosure may be made without departing from the spirit and scope of the present disclosure.

What is claimed is:

1. A heat transfer device, comprising:
    a working region made from a first superconducting material having a superconducting state and a normal state when magnetized, and wherein the first superconducting material has a first energy gap while in the superconducting state;
    a metallic substrate connected to the working region at a first tunnel junction;
    a heat sink made from a second superconducting material and connected to the working region at a second tunnel junction, and wherein the second superconducting material has a second energy gap that is larger than the first energy gap.

2. The heat transfer device of claim 1, further comprising a magnetizer configured to adiabatically magnetize the working region so as to drive the first superconducting material to the normal state.

3. The heat transfer device of claim 2, wherein the magnetizer comprises a current source configured to selectively apply a supercurrent to the heat sink to induce a magnetic field.

4. The heat transfer device of claim 1, wherein the first and/or second tunnel junctions comprise an insulator.

5. The heat transfer device of claim 2, wherein the first and/or second tunnel junctions comprise a disordered oxide.

6. The heat transfer device of claim 1, wherein the metallic substrate is Copper, Gold, Silver, or Aluminum doped with Manganese.

7. The heat transfer device of claim 1, wherein the first superconducting material is Tantalum, Aluminum, Tin, Mercury, or Indium.

8. The heat transfer device of claim 1, wherein the second superconducting material is Niobium, Niobium Nitride, Niobium-Titanium, Niobium Nitride-Titanium, Niobium-Germanium, Magnesium Diboride, or a covalent superconductor.

9. The heat transfer device of claim 1, where the substrate is suspended to reduce phonon-mediated thermal transport between the substrate and the working region.

10. The heat transfer device of claim 9, wherein the working region is suspended to reduce phonon-mediated thermal transport between the working region and the heat sink.

11. The heat transfer device of claim 1, wherein the metallic substrate is Copper, the first superconducting material is Tantalum, and the second superconducting material is Niobium.

12. The heat transfer device of claim 11, wherein the first and/or second tunnel junctions are Tantalum Oxide (TaO and/or $Ta_2O_5$).

13. A single-photon detector comprising a heat transfer device according to claim 1.

14. A sensor comprising a heat transfer device according to claim 1.

* * * * *